(12) United States Patent
Xue et al.

(10) Patent No.: US 11,637,134 B2
(45) Date of Patent: Apr. 25, 2023

(54) ARRAY SUBSTRATE, METHOD FOR MANUFACTURING THE SAME, AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventors: Jinjin Xue, Beijing (CN); Dawei Shi, Beijing (CN); Feng Li, Beijing (CN); Lei Yao, Beijing (CN); Wentao Wang, Beijing (CN); Haifeng Xu, Beijing (CN); Lu Yang, Beijing (CN); Lin Hou, Beijing (CN); Jinfeng Wang, Beijing (CN); Mei Li, Beijing (CN); Yezhou Fang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 191 days.

(21) Appl. No.: 17/243,817

(22) Filed: Apr. 29, 2021

(65) Prior Publication Data
US 2021/0249450 A1  Aug. 12, 2021

Related U.S. Application Data

(62) Division of application No. 16/382,679, filed on Apr. 12, 2019, now Pat. No. 11,031,419.

(30) Foreign Application Priority Data

Sep. 17, 2018  (CN) .......................... 201811082870.2

(51) Int. Cl.
*H01L 27/12* (2006.01)
*G02F 1/1343* (2006.01)
(Continued)

(52) U.S. Cl.
CPC ........ *H01L 27/1255* (2013.01); *G02F 1/1368* (2013.01); *G02F 1/13439* (2013.01);
(Continued)

(58) Field of Classification Search
CPC ... H01L 27/12; H01L 27/1255; H01L 27/124; H01L 27/1248; H01L 27/1288; G02F 1/13439; G02F 1/1368
See application file for complete search history.

(56) References Cited

U.S. PATENT DOCUMENTS 6,806,927 B2  10/2004  Nimura
6,862,059 B2   3/2005  Murai et al.
(Continued)

FOREIGN PATENT DOCUMENTS

CN  2630888 Y  8/2004
CN  2685924 Y  3/2005
(Continued)

OTHER PUBLICATIONS

First Office Action, including Search Report, for Chinese Patent Application No. 201811082870.2, dated Jan. 19, 2021, 16 pages.
(Continued)

*Primary Examiner* — Jaehwan Oh
*Assistant Examiner* — John M Parker
(74) *Attorney, Agent, or Firm* — Westman, Champlin & Koehler, P.A.

(57) ABSTRACT

An array substrate and a method for manufacturing the same, and a display device are provided. The array substrate includes a base substrate and the array substrate includes a plurality of pixel units. In each of the plurality of pixel units,
(Continued)

the array substrate includes a thin film transistor and a storage capacitor disposed above the base substrate, the storage capacitor includes a metal layer, an intermediate layer, and a reflective layer disposed in a stacked manner, the metal layer being adjacent to the base substrate. The array substrate further includes a common electrode layer disposed on a side of the storage capacitor facing away from the base substrate, the reflective layer is electrically connected to the common electrode layer, and the metal layer is electrically connected to an active layer of the thin film transistor.

10 Claims, 2 Drawing Sheets

(51) Int. Cl.
*G02F 1/1368* (2006.01)
*G02F 1/1362* (2006.01)

(52) U.S. Cl.
CPC ...... *H01L 27/1288* (2013.01); *G02F 1/13685* (2021.01); *G02F 1/134363* (2013.01); *G02F 1/136227* (2013.01); *G02F 1/136231* (2021.01); *G02F 2201/121* (2013.01); *G02F 2201/123* (2013.01); *G02F 2202/104* (2013.01); *G02F 2203/02* (2013.01)

(56) References Cited

U.S. PATENT DOCUMENTS

| | | | |
|---|---|---|---|
| 7,141,180 | B2 | 11/2006 | Park et al. |
| 7,791,695 | B2 | 9/2010 | Toyota et al. |
| 7,859,618 | B2 | 12/2010 | Kim |
| 8,018,538 | B2 | 9/2011 | Mori et al. |
| 8,531,365 | B2 | 9/2013 | Lai et al. |
| 8,735,187 | B2 | 5/2014 | Lee et al. |
| 8,845,343 | B2 | 9/2014 | Lee et al. |
| 8,982,303 | B2 | 3/2015 | Yu et al. |
| 10,401,694 | B2 | 9/2019 | Wang et al. |
| 2003/0174267 | A1 | 9/2003 | Nimura |
| 2003/0231267 | A1 | 12/2003 | Murai et al. |
| 2004/0072444 | A1 | 4/2004 | Park et al. |
| 2008/0239218 | A1 | 10/2008 | Kim |
| 2008/0252803 | A1 | 10/2008 | Mori et al. |
| 2009/0115950 | A1 | 5/2009 | Toyota et al. |
| 2010/0259700 | A1 | 10/2010 | Lai et al. |
| 2011/0272697 | A1 | 11/2011 | Lee et al. |
| 2013/0077003 | A1 | 3/2013 | Oikawa et al. |
| 2014/0226099 | A1 | 8/2014 | Yu et al. |
| 2014/0231806 | A1 | 8/2014 | Lee et al. |
| 2015/0349000 | A1 | 12/2015 | Kim et al. |
| 2016/0357044 | A1* | 12/2016 | Lv .............. G02F 1/13439 |
| 2019/0227397 | A1 | 7/2019 | Wang et al. |

FOREIGN PATENT DOCUMENTS

| | | |
|---|---|---|
| CN | 1625590 A | 6/2005 |
| CN | 101038915 A | 9/2007 |
| CN | 101276108 A | 10/2008 |
| CN | 101285976 A | 10/2008 |
| CN | 101424853 A | 5/2009 |
| CN | 102236230 A | 11/2011 |
| CN | 103984175 A | 8/2014 |
| CN | 108227325 A | 6/2018 |
| TW | 201037442 A | 10/2010 |

OTHER PUBLICATIONS

U.S. Patent Office issued prosecution for U.S. Appl. No. 16/382,679, filed Apr. 12, 2019, including: Corrected Notice of Allowability dated Apr. 13, 2021, 2 pages; Notice of Allowance and Fees Due (PTOL-85) dated Feb. 22, 2021, 8 pages; Non-Final Rejection dated Nov. 27, 2020, 8 pages; Restriction Requirement dated Jul. 23, 2020, 7 pages; 25 pages total.

* cited by examiner ical field
ARRAY SUBSTRATE, METHOD FOR MANUFACTURING THE SAME, AND DISPLAY DEVICE

CROSS-REFERENCE TO RELATED APPLICATION

This application is Divisional Applications of U.S. application Ser. No. 16/382,679, filed on Apr. 12, 2019, which published as U.S. 2020/0091203 A1, on Mar. 19, 2020, and claims priority of Chinese Patent Application No. 201811082870.2 filed on Sep. 17, 2018 in China National Intellectual Property Administration, the disclosures of which re incorporated herein by reference in their entireties.

TECHNICAL FIELD

Embodiments of the present disclosure relate to the field of display technology, and in particular, to an array substrate, a method for manufacturing the same, and a display device.

BACKGROUND

Reflective or semi-transmissive display has always been an important technology for low power consumption liquid crystal display. In general, power consumption of a backlight source is about 70% to 80% of a total power consumption of the liquid crystal display. The reflective or semi-transmissive display device can make full use of the ambient light source, thereby saving power consumption of the backlight source. In addition, the presence of a leakage current in a liquid crystal display product causes that it is difficult to maintain the voltage of liquid crystal pixel electrodes, which adversely affects display effect.

SUMMARY

Some embodiments of the present disclosure provide an array substrate, comprising a base substrate, wherein the array substrate comprises a plurality of pixel units, wherein, in each of the plurality of pixel units, the array substrate comprises a thin film transistor and a storage capacitor disposed above the base substrate, wherein the storage capacitor comprises a metal layer, an intermediate layer, and a reflective layer disposed in a stacked manner, the metal layer being adjacent to the base substrate, and wherein the array substrate further comprises a common electrode layer disposed on a side of the storage capacitor facing away from the base substrate, the reflective layer is electrically connected to the common electrode layer, and the metal layer is electrically connected to an active layer of the thin film transistor.

Optionally, the thin film transistor comprises the active layer, a gate insulating layer, a gate electrode layer, an interlayer dielectric layer and a source-drain metal layer stacked sequentially on a side of the base substrate, and the active layer is adjacent to the base substrate.

Optionally, the gate electrode layer and the metal layer are formed by using one and the same mask, the interlayer dielectric layer serves as the intermediate layer of the storage capacitor, and the metal layer is electrically connected to the active layer through a via hole provided in the gate insulating layer.

Optionally, the source-drain metal layer and the metal layer are formed by using one and the same mask, and the metal layer is electrically connected to the active layer through a via hole provided in the interlayer dielectric layer and the gate insulating layer.

Optionally, the array substrate further comprises a planarization layer disposed between the storage capacitor and the common electrode layer, and the common electrode layer is electrically connected to the reflective layer through a via hole provided in the planarization layer.

Optionally, the array substrate further comprises a planarization layer which serves as the intermediate layer of the storage capacitor, and the common electrode layer is in direct and electrical contact with the reflective layer.

Optionally, the array substrate further comprises a passivation layer and a pixel electrode layer disposed on a side of the common electrode layer facing away from the base substrate, and the pixel electrode layer is electrically connected to the thin film transistor through a via hole provided in the passivation layer.

Optionally, the reflective layer is made of silver material.

Optionally, the thin film transistor comprises a gate electrode layer, a gate insulating layer, the active layer, and a source-drain metal layer stacked sequentially on a side of the base substrate.

Optionally, the active layer comprises a channel region and a conduction region, the metal layer is electrically connected to the conduction region of the active layer, and the source-drain metal layer is electrically connected to the conduction region of the active layer.

Optionally, an orthographic projection of the gate electrode layer on the base substrate covers an orthographic projection of the channel region on the base substrate.

Optionally, the active layer of the thin film transistor is made of a low temperature polysilicon material.

Some embodiments of the present disclosure further provide a display device, comprising the array substrate according to any one of the above embodiments.

Some embodiments of the present disclosure further provide a method for manufacturing an array substrate, comprising:

providing a base substrate;

forming a thin film transistor and a storage capacitor above the base substrate, the storage capacitor comprising a metal layer, an intermediate layer, and a reflective layer sequentially formed above the base substrate, the metal layer being electrically connected to an active layer of the thin film transistor;

forming a common electrode layer on a side of the storage capacitor facing away from the base substrate, the reflective layer being electrically connected to the common electrode layer.

Optionally, the forming a thin film transistor and a storage capacitor above the base substrate comprises:

forming the active layer, a gate insulating layer, a gate electrode layer, an interlayer dielectric layer, and a source-drain metal layer on a side of the base substrate sequentially.

Optionally, the metal layer and the gate electrode layer are formed by using one and the same mask, the interlayer dielectric layer serves as the intermediate layer of the storage capacitor, and the metal layer is electrically connected to the active layer through a via hole provided in the gate insulating layer.

Optionally, the metal layer and the source-drain metal layer are formed by using one and the same mask, and the metal layer is electrically connected to the active layer through a via hole provided in the interlayer dielectric layer and the gate insulating layer.

Optionally, before the forming a common electrode layer on a side of the storage capacitor facing away from the base substrate, the method further comprises:

forming a planarization layer on the side of the storage capacitor facing away from the base substrate, wherein the common electrode layer is formed on a side of the planarization layer facing away from the base substrate, and the common electrode layer is electrically connected to the reflective layer through a via hole provided in the planarization layer.

Optionally, before the forming a common electrode layer on a side of the storage capacitor facing away from the base substrate, the method further comprises:

forming a planarization layer on a side of the metal layer and the source-drain metal layer facing away from the base substrate, wherein the planarization layer serves as the intermediate layer of the storage capacitor, and the common electrode layer is in direct and electrical contact with the reflective layer.

Optionally, the method further comprises:

forming a passivation layer and a pixel electrode layer on a side of the common electrode layer facing away from the base substrate sequentially, the pixel electrode layer being electrically connected to the thin film transistor through a via hole provided in the passivation layer.

BRIEF DESCRIPTION OF THE DRAWINGS

In order to more clearly illustrate the technical solutions of the embodiments of the present disclosure, the drawings accompanying the description of the embodiments of the present disclosure will be briefly described below. It is obvious that the drawings in the following description only represent some embodiments of the present disclosure, and other drawings may be obtained based on these drawings by those skilled in the art without any creative efforts.

DETAILED DESCRIPTION OF EMBODIMENTS

In order to make the above-described objectives, features and advantages of the embodiments of the present disclosure more apparent and be easily understood, the present disclosure will be further described in detail with reference to the accompanying drawings and the embodiments.

Embodiments of the present disclosure provide an array substrate, a method for manufacturing the same, and a display device to reduce power consumption and improve display effect.

Figure 1:
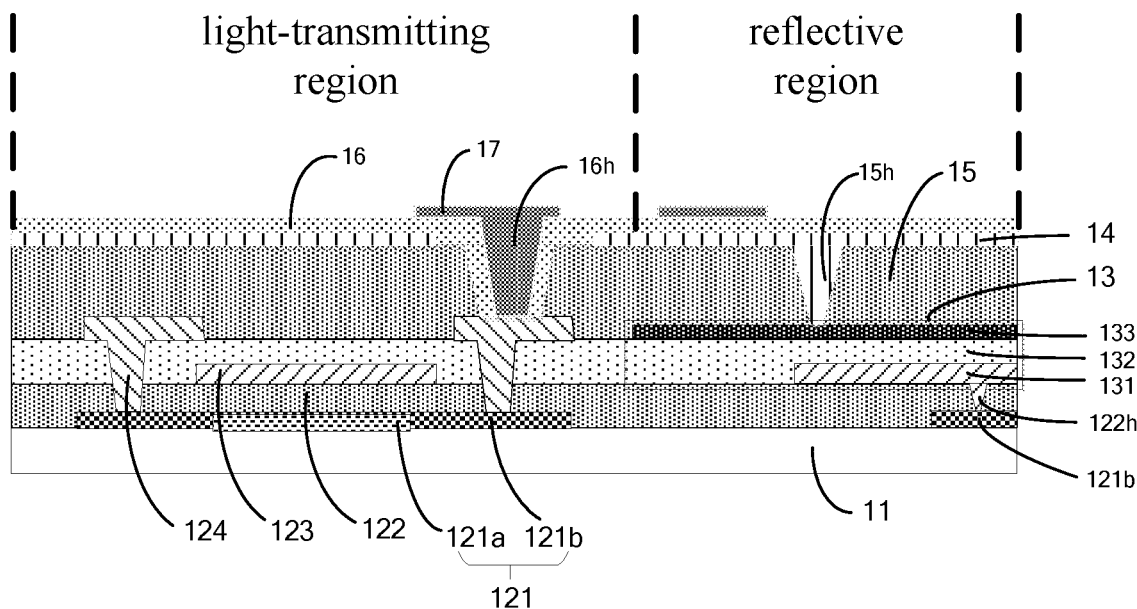
FIG. 1 is a cross-sectional structural view of an array substrate according to an embodiment of the present disclosure.

An embodiment of the present disclosure provides an array substrate, which may include a plurality of pixel units, each of the pixel units is divided into a light-transmitting region and a reflective region. Referring to FIG. 1, the array substrate includes: a base substrate 11; and a thin film transistor and a storage capacitor 13 disposed on the base substrate 11. The storage capacitor 13 includes a metal layer 131, an interlayer dielectric layer 132 (intermediate layer) and a reflective layer 133 which are arranged and stacked on a side of the base substrate 11, and the metal layer 131 is arranged adjacent to the base substrate 11. A common electrode layer 14 is disposed on a side of the storage capacitor 13 facing away from the base substrate 11, the reflective layer 133 is electrically connected to the common electrode layer 14, and the metal layer 131 is electrically connected to an active layer of the thin film transistor. In each pixel unit, the region corresponding to the reflective layer 133 is the reflective region, and the region except the reflective region is the light-transmitting region.

Specifically, the base substrate 11 may include a based such as a glass base substrate, a flexible base substrate, or the like, and may further include a shielding layer, a buffer layer, and the like formed on the base.

The proportions of the light-transmitting region and the reflective region of each pixel unit to the corresponding pixel unit may be adjusted by changing the size of the reflective layer 133 according to product application properties. Since the provision of the reflective layer in the reflective region can reflect ambient light, the power consumption of the backlight source may be reduced.

The structure of the thin film transistor disposed on the base substrate 11 may be various forms, for example, it may include a gate electrode layer, a gate insulating layer, an active layer, and a source-drain metal layer stacked in this order on the base substrate 11, or it may include an active layer, a gate insulating layer, a gate electrode layer, an interlayer dielectric layer, and a source-drain metal layer stacked in this order on the base substrate 11. The specific structure of the thin film transistor is not limited in the embodiments of the present disclosure. The array substrate corresponding to the thin film transistor having the latter structure will be described in detail in subsequent embodiments.

Two electrode plates of the storage capacitor 13 disposed on the base substrate 11 are the metal layer 131 and the reflective layer 133, respectively. Voltages applied on the two electrode plate of the liquid crystal pixel capacitor are a voltage of a pixel electrode and a voltage of a common electrode, respectively. In order to connect the storage capacitor 13 in parallel with a liquid crystal pixel capacitor to store the voltage of the liquid crystal pixel capacitor, the metal layer 131 may be electrically connected to the active layer of the thin film transistor, and the reflective layer 133 may be electrically connected to the common electrode. It should be noted that the way in which the metal layer 131 is electrically connected to the active layer and the way in which the reflective layer 133 is electrically connected to the common electrode may be various forms. All the connection ways which are capable of allowing the storage capacitor 13 to store the voltage of the liquid crystal pixel capacitor fall within the scope of the present disclosure. The specific implementation of the connection of the metal layer 131 to the active layer of the thin film transistor and the connection of the reflective layer 133 to the common electrode will be described in detail later.

According to the array substrate provided in the embodiments of the present disclosure, a storage capacitor is formed by using the metal layer and the reflective layer, and the storage capacitor is electrically connected in parallel with the liquid crystal pixel capacitor. When the liquid crystal pixel capacitor generates electric charge loss due to a leakage current, the parallel storage capacitor can supplement electric charges for the liquid crystal pixel capacitor in time, so that the voltage variation of the liquid crystal pixel capacitor caused by the leakage current is reduced, thereby effectively increasing potential retention capability of the liquid crystal pixel capacitor and improving the display effect. In addition, since the reflective layer disposed in the reflective region can reflect the ambient light, the power consumption of the backlight source may be reduced; and since the potential retention capability of the liquid crystal pixel capacitor is improved, the scanning frequency of the picture may be appropriately reduced, thereby further reducing the power consumption of the backlight source.

The common electrode layer 14 may be disposed on a side of the thin film transistor and the storage capacitor 13 facing away from the base substrate 11, and it may be made of ITO.

In an implementation manner of this embodiment, referring to FIG. 1, the thin film transistor may include an active layer 121, a gate insulating layer 122, a gate electrode layer 123, and an interlayer dielectric layer 132 and a source-drain metal layer 124 stacked in this order on a side of the base substrate 11, and the active layer 121 is disposed adjacent to the base substrate 11. The gate electrode layer 123 and the metal layer 131 are formed by using one and the same mask, and the metal layer 131 is electrically connected to the active layer 121 through a via hole 122h provided in the gate insulating layer 122.

In practical applications, referring to FIG. 1, the active layer 121 may include a channel region 121a and a conduction region 121b, and an orthographic projection of the gate electrode layer 123 on the base substrate 11 covers an orthographic projection of the channel region 121a on the base substrate 11. The material of the channel region 121a is semiconductor material, the channel region 121a is used for controlling conduction or shutoff between a source and a drain according to a voltage of the gate electrode layer 123. The material of the conduction region 121b may be a semiconductor material or metal material or the like which is made conductive by doping or other manners. Specifically, the metal layer 131 may be electrically connected to the conduction region 121b of the active layer 121 through the via hole 122h provided in the gate insulating layer 122. It should be noted that the conduction region 121b connected to the source-drain metal layer and the conduction region 121b connected to the metal layer 131 in FIG. 1 are integrally connected to each other.

In order to realize the connection between the common electrode layer 14 and the reflective layer 133, the array substrate provided in this embodiment may further include a planarization layer 15 disposed between the storage capacitor 13 and the common electrode layer 14, and the common electrode layer 14 is electrically connected to the reflective layer 133 through a via hole 15h provided in the planarization layer 15.

It should be noted that the connection of the metal layer 131 to the active layer of the thin film transistor and the connection of the reflective layer 133 to the common electrode layer 14 are not limited to the above implementations. For example, the metal layer 131 may be formed in synchronization with the source-drain metal layer 124 and electrically connected to the active layer 121 through a via hole provided in the interlayer dielectric layer 132 and the gate insulating layer 122, and accordingly the reflective layer 133 may be disposed between the planarization layer 15 and the common electrode layer 14, that is, the reflective layer 133 and the common electrode layer 14 are in direct contact with each other. The metal layer 131 may also be electrically connected to a conductive structure such as a source/drain electrode (a source or a drain) or a pixel electrode electrically connected to the active layer, thereby achieving the connection of the metal layer 131 with the active layer. The reflective layer 133 may also be connected to a conductive structure connected to the common electrode layer 14, finally achieving the connection of the reflective layer 133 with the common electrode layer 14. In summary, any array substrate structures which allow electrically connecting the metal layer 131 to the active layer of the thin film transistor and electrically connecting the reflective layer 133 to the common electrode layer 14 fall within the scope of the present disclosure.

In practical applications, the above-described array substrate may further include a passivation layer 16 and a pixel electrode layer 17 disposed on a side of the common electrode layer 14 facing away from the base substrate 11, and the pixel electrode layer 17 is electrically connected to the thin film transistor through a via hole 16h provided in the passivation layer 16.

Specifically, the pixel electrode layer 17 may be electrically connected to the source-drain metal layer 124 of the thin film transistor through the via hole 16h. The material of the pixel electrode layer 17 may be ITO.

In the above embodiments, the material of the reflective layer may be a metal material having a high reflectivity, such as metallic silver.

Since low temperature polysilicon (LTPS) products have relatively serious leakage current problem, the material of the active layer of the thin film transistor in each of the above embodiments may be a low temperature polysilicon (LTPS) material or the like, so as to make the effect of improving the leakage current more remarkable.

Figure 2:
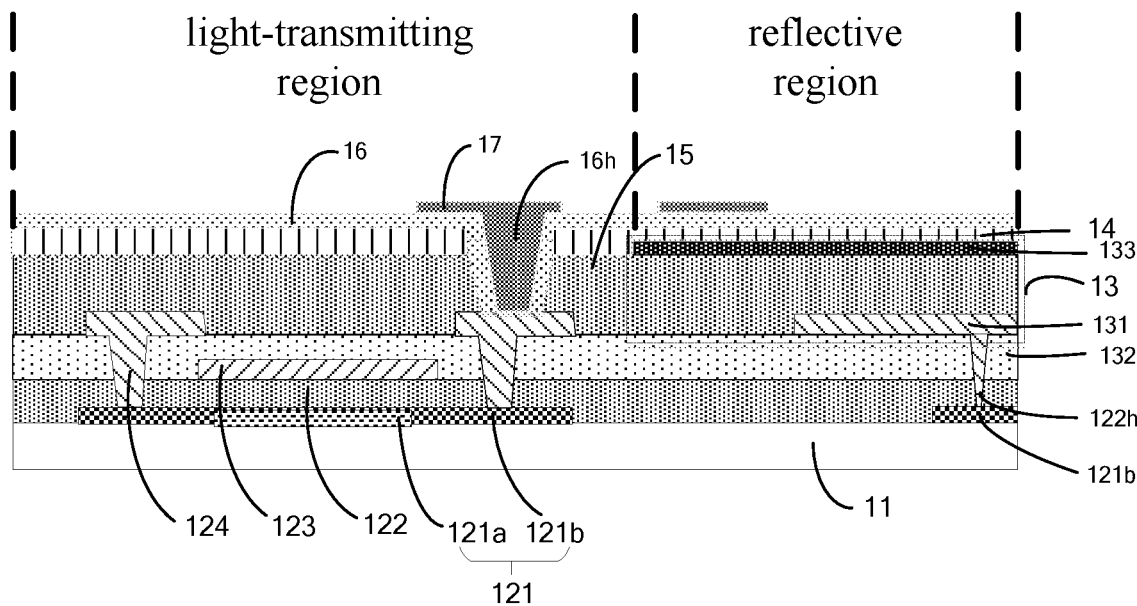
FIG. 2 is a cross-sectional structural view of an array substrate according to another embodiment of the present disclosure.

FIG. 2 is a cross-sectional structural view of an array substrate according to another embodiment of the present disclosure. The difference of the embodiment shown in FIG. 2 from that in FIG. 1 lies in the arrangement position of the storage capacitor 13. In the embodiment of FIG. 2, the metal layer 131 of the storage capacitor 13 is disposed in the same layer as the source-drain metal layer 124, and the reflective layer 133 is disposed between the planarization layer 15 and the common electrode layer 14. Thus, the intermediate layer between the metal layer 131 and the reflective layer 133 is the planarization layer 15, and the storage capacitor 13 includes the metal layer 131, the planarization layer 15, and the reflective layer 133 which are stacked. The metal layer 131 and the source-drain metal layer 124 may be formed by the same patterning process, and electrically connected to the active layer 121 through via holes 122h provided in the interlayer dielectric layer 132 and the gate insulating layer 122, and correspondingly the reflective layer 133 and the common electrode layer 14 are in direct electrical contact with each other.

Another embodiment of the present disclosure further provides a display device, which may include the array substrate described in any of the above embodiments.

It should be noted that the display device in this embodiment may be any product or component having a display function, such as a display panel, an electronic paper, a mobile phone, a tablet computer, a television, a notebook computer, a digital photo frame, a navigator, and the like.

Figure 3:
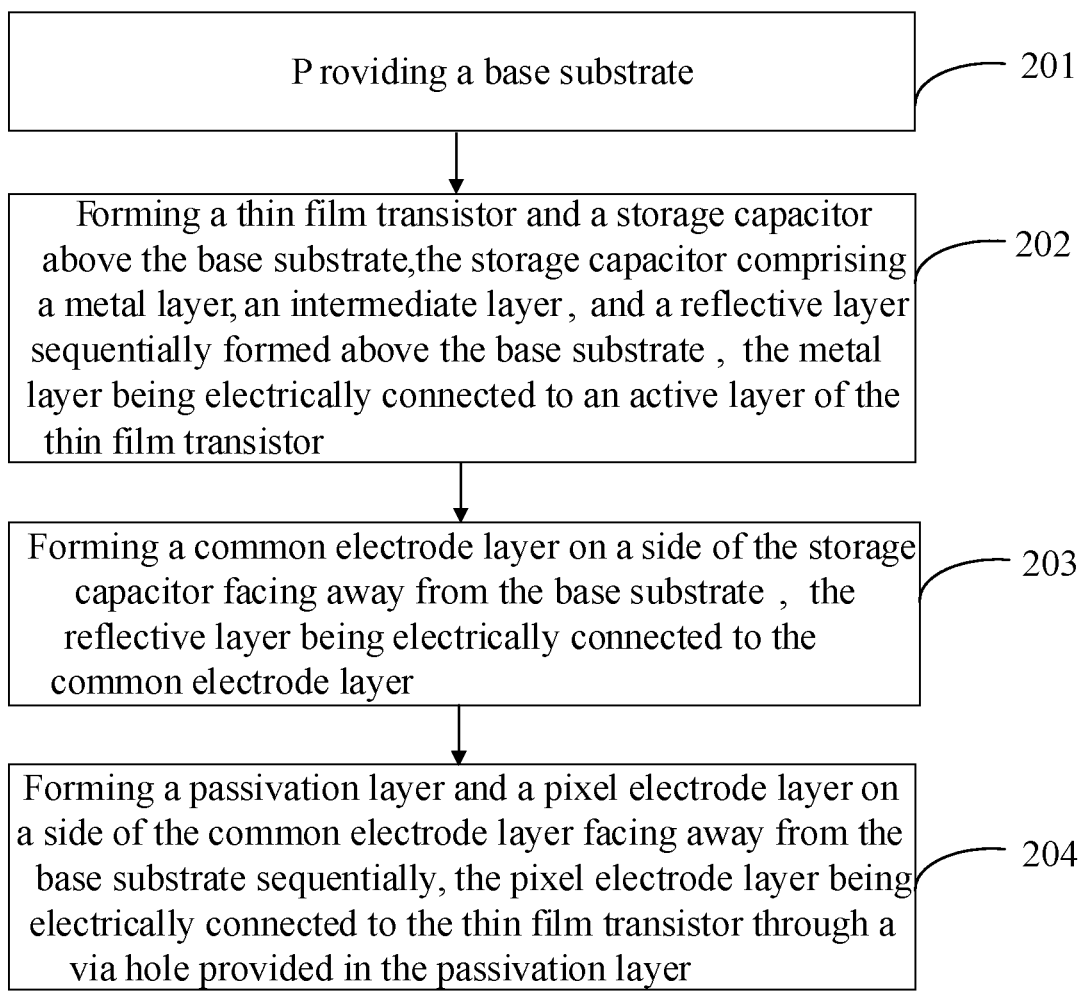
FIG. 3 is a flow chart of a method for manufacturing an array substrate according to an embodiment of the present disclosure.

Another embodiment of the present disclosure further provides a method for manufacturing an array substrate. Referring to FIG. 3, the manufacturing method may include following steps:

Step 201: providing a base substrate.

Specifically, this step may include providing a base such as a glass base substrate, a flexible base substrate, or the like, and may further include a step of forming a shielding layer, a buffer layer, and the like on the base.

Step 202: forming a thin film transistor and a storage capacitor above the base substrate, the storage capacitor comprising a metal layer, an intermediate layer, and a reflective layer sequentially formed above the base substrate, the metal layer being electrically connected to an active layer of the thin film transistor.

Specifically, in an implementation of this embodiment, the step of forming a thin film transistor and a storage capacitor above the base substrate in the step 202 may further include:

forming the active layer, a gate insulating layer, a gate electrode layer, an interlayer dielectric layer, and a source-drain metal layer on a side of the base substrate sequentially, wherein the metal layer and the gate electrode layer are formed by using one and the same mask, the interlayer dielectric layer serves as the intermediate layer of the storage capacitor, and the metal layer is electrically connected to the active layer through a via hole provided in the gate insulating layer.

Alternatively, the metal layer and the source-drain metal layer are formed by using one and the same mask, and the metal layer is electrically connected to the active layer through a via hole provided in the interlayer dielectric layer and the gate insulating layer.

Specifically, various layer structures of the thin film transistor may be formed by patterning processes. The via hole for connecting the metal layer to the active layer may be formed by a GI Mask during the preparation of the gate insulating layer GI. In addition, since the metal layer and the gate electrode layer may be formed by one and the same mask, a pattern corresponding to the metal layer will be added to the mask for forming the gate electrode layer.

After the source-drain metal layer of the thin film transistor is formed, the reflective layer is formed. The material of metallic silver may be used for forming the reflective layer, and the pattern of the reflective layer structure with desired design is formed by processes including a sputtering film formation method, an exposure process, and/or an etching process.

Step 203: forming a common electrode layer on a side of the storage capacitor facing away from the base substrate, the reflective layer being electrically connected to the common electrode layer.

Specifically, the step 203 may further include:

forming a planarization layer on a side of the storage capacitor facing away from the base substrate;

forming the common electrode layer on a side of the planarization layer facing away from the base substrate, the common electrode layer being electrically connected to the reflective layer through a via hole provided in the planarization layer.

Alternatively, the step 203 may include:

forming a planarization layer on a side of the metal layer and the source-drain layer metal layer facing away from the base substrate, wherein the planarization layer serves as the intermediate layer of the storage capacitor, and the common electrode layer is in direct contact with the reflective layer.

Specifically, the via hole for connecting the common electrode layer to the reflective layer may also be formed by a patterning process.

In practical applications, the above manufacturing method may further include: Step 204: forming a passivation layer and a pixel electrode layer on a side of the common electrode layer facing away from the base substrate sequentially, the pixel electrode layer being electrically connected to the thin film transistor through a via hole provided in the passivation layer.

The array substrate described in any of the above embodiments may be manufactured by the manufacturing method provided in this embodiment.

The embodiments of the present disclosure provide an array substrate, a method for manufacturing the same, and a display device. The array substrate includes a plurality of pixel units, and each of the pixel units is divided into a light-transmitting region and a reflective region. The array substrate includes: a base substrate; and a thin film transistor and a storage capacitor disposed on the base substrate. The storage capacitor includes a metal layer, an intermediate layer and a reflective layer which are stacked on a side of the base substrate, and the metal layer is adjacent to the base substrate. A common electrode layer is disposed on a side of the storage capacitor facing away from the base substrate, the reflective layer is electrically connected to the common electrode layer, and the metal layer is electrically connected to an active layer of the thin film transistor. The storage capacitor is formed by using the metal layer and the reflective layer, and the storage capacitor is electrically connected in parallel with the liquid crystal pixel capacitor. When the liquid crystal pixel capacitor has electric charge loss due to leakage current, the parallel storage capacitor can supplement electric charges for the liquid crystal pixel capacitor in time, so that the voltage variation of the liquid crystal pixel capacitor caused by the leakage current is reduced, thereby effectively increasing potential retention capability of the liquid crystal pixel capacitor and improving the display effect. In addition, since the reflective layer disposed in the reflective region can reflect the ambient light, the power consumption of the backlight source may be reduced; and since the potential retention capability of the liquid crystal pixel capacitor is improved, the scanning frequency of the picture may be appropriately reduced, thereby further reducing the power consumption of the backlight source.

The various embodiments of the specification of the present disclosure are described in a progressive manner, it is focused on differences of each embodiment from other embodiments, and the same or similar parts between the various embodiments may be referred to each other.

Finally, it should also be noted that, relational terms such as first, second and the like in the context are merely used to distinguish one entity or operation from another entity or operation, but do not necessarily require or imply there are such actual relationship or order between these entities or operations. Furthermore, the terms "comprise", "include" or any other variations are intended to encompass non-exclusive inclusion, such that a process, method, item or device that comprises a series of elements comprises not only such elements but also other elements that are not specifically listed, or inherent elements that the process, method, item or device has. Without any other limitations, an element defined by the phrase "comprising a . . . " does not exclude the presence of additional equivalent elements in the process, method, item, or device including the elements.

An array substrate, a method for manufacturing an array substrate and a display device provided by the embodiments of the present disclosure have been described in detail above. Herein the principles and implementations of the present disclosure are described with reference to specific examples. The description of the above embodiments is only used to assist in the understanding of the implementations of the present disclosure and its core ideas. Moreover, in light of the ideas of the present disclosure, changes may be made to specific embodiments and application scopes by those skilled in the art. In conclusion, the content of the specification of the present disclosure should not be construed as limiting the present disclosure.

The invention claimed is:

1. An array substrate, comprising a base substrate, wherein the array substrate comprises a plurality of pixel units,
wherein, in each of the plurality of pixel units, the array substrate comprises a thin film transistor and a storage capacitor disposed above the base substrate,
wherein the storage capacitor comprises a metal layer, an intermediate layer, and a reflective layer disposed in a stacked manner, the metal layer being adjacent to the base substrate, and
wherein the array substrate further comprises a common electrode layer disposed on a side of the storage capacitor facing away from the base substrate, the reflective layer is electrically connected to the common electrode layer, and the metal layer is electrically connected to an active layer of the thin film transistor;
wherein the thin film transistor comprises the active layer, a gate insulating layer, a gate electrode layer, an interlayer dielectric layer and a source-drain metal layer stacked sequentially on a side of the base substrate, and the active layer is adjacent to the base substrate; and
wherein the source-drain metal layer and the metal layer are formed by using one and the same mask, and the metal layer is electrically connected to the active layer through a via hole provided in the interlayer dielectric layer and the gate insulating layer.

2. The array substrate according to claim 1, wherein the array substrate further comprises a planarization layer which serves as the intermediate layer of the storage capacitor, and the common electrode layer is in direct and electrical contact with the reflective layer.

3. The array substrate according to claim 1, wherein the array substrate further comprises a passivation layer and a pixel electrode layer disposed on a side of the common electrode layer facing away from the base substrate, and the pixel electrode layer is electrically connected to the thin film transistor through a via hole provided in the passivation layer.

4. The array substrate according to claim 1, wherein the reflective layer is made of silver material.

5. The array substrate according to claim 1, wherein the thin film transistor comprises a gate electrode layer, a gate insulating layer, the active layer, and a source-drain metal layer stacked sequentially on a side of the base substrate.

6. The array substrate according to claim 1, wherein the active layer of the thin film transistor is made of a low temperature polysilicon material.

7. A display device, comprising the array substrate according to claim 1.

8. A method for manufacturing an array substrate, comprising:
providing a base substrate;
forming a thin film transistor and a storage capacitor above the base substrate, the storage capacitor comprising a metal layer, an intermediate layer, and a reflective layer sequentially formed above the base substrate, the metal layer being electrically connected to an active layer of the thin film transistor;
forming a common electrode layer on a side of the storage capacitor facing away from the base substrate, the reflective layer being electrically connected to the common electrode layer;
wherein the forming a thin film transistor and a storage capacitor above the base substrate comprises:
forming the active layer, a gate insulating layer, a gate electrode layer, an interlayer dielectric layer, and a source-drain metal layer on a side of the base substrate sequentially;
wherein the metal layer and the source-drain metal layer are formed by using one and the same mask, and the metal layer is electrically connected to the active layer through a via hole provided in the interlayer dielectric layer and the gate insulating layer.

9. The method according to claim 8, wherein, before the forming a common electrode layer on a side of the storage capacitor facing away from the base substrate, the method further comprises:
forming a planarization layer on a side of the metal layer and the source-drain metal layer facing away from the base substrate,
wherein the planarization layer serves as the intermediate layer of the storage capacitor, and the common electrode layer is in direct and electrical contact with the reflective layer.

10. The method according to claim 8, wherein the method further comprises:
forming a passivation layer and a pixel electrode layer on a side of the common electrode layer facing away from the base substrate sequentially, the pixel electrode layer being electrically connected to the thin film transistor through a via hole provided in the passivation layer.

* * * * *